(12) United States Patent
Sung

(10) Patent No.: US 8,952,735 B2
(45) Date of Patent: Feb. 10, 2015

(54) INTEGRATED CIRCUIT

(71) Applicant: SK Hynix Inc., Gyeonggi-do (KR)

(72) Inventor: Ha Min Sung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/084,289

(22) Filed: Nov. 19, 2013

(65) Prior Publication Data

US 2014/0361816 A1 Dec. 11, 2014

(30) Foreign Application Priority Data

Jun. 11, 2013 (KR) ........................ 10-2013-0066487

(51) Int. Cl.
*H03L 7/00* (2006.01)
*H03K 3/015* (2006.01)
(52) U.S. Cl.
CPC ..................................... *H03K 3/015* (2013.01)
USPC .......................................................... 327/143

(58) Field of Classification Search
USPC .......................................................... 327/143
See application file for complete search history.

(56) References Cited

U.S. PATENT DOCUMENTS 7,049,865 B2 * 5/2006 Parker et al. .................. 327/143

FOREIGN PATENT DOCUMENTS

KR 1020120038901 4/2012

* cited by examiner

*Primary Examiner* — Daniel Rojas
(74) *Attorney, Agent, or Firm* — IP & T Group LLP

(57) ABSTRACT

An integrated circuit includes a reset control circuit suitable for outputting a reset signal when one of a first voltage and a second voltage has lower level than a reference level, and a reset execution circuit suitable for resetting a peripheral circuit based on the reset signal.

16 Claims, 8 Drawing Sheets

INTEGRATED CIRCUIT

CROSS-REFERENCE TO RELATED APPLICATION

The present application claims priority of Korean patent application number 10-2013-0066487 filed on Jun. 11, 2013, the entire disclosure of which is incorporated herein by reference in its entirety.

BACKGROUND

1. Field of Invention

The present invention relates to an integrated circuit, and more particularly, to an integrated circuit including a reset function.

2. Description of Related Art

When a supply of a power source is stopped, or a power source is decreased to a reference level or lower, a circuit using the power source cannot perform normal operation. Further, if two power sources are provided as operation voltages, when a supply of one power source is stopped, or the power source is decreased to the reference level or lower, the circuit cannot perform normal operation. In this case, an abnormal current path is formed between a power source and a ground, so that a current consumption may also be sharply increased.

As described above, when the power source is decreased to the reference level or lower, an operation of initializing the circuit is required in order to stabilize the circuit and improve an electrical characteristic.

BRIEF SUMMARY

The present invention has been made in an effort to provide an integrated circuit capable of stabilizing a circuit and improving an electrical characteristic.

An embodiment of the present invention provides an integrated circuit including a reset control circuit suitable for outputting a reset signal when one of a first voltage and a second voltage has lower level than a reference level, and a reset execution circuit suitable for resetting a peripheral circuit based on the reset signal.

Another embodiment of the present invention provides an integrated circuit including a peripheral circuit using one or more of a first voltage and a second voltage as an operation voltage source and a reset circuit suitable for resetting the peripheral circuit when one of the first voltage and the second voltage has lower level than a reference level.

According to the embodiment of the present invention, it is possible to stabilize a circuit and improve an electrical characteristic.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Figure 1:
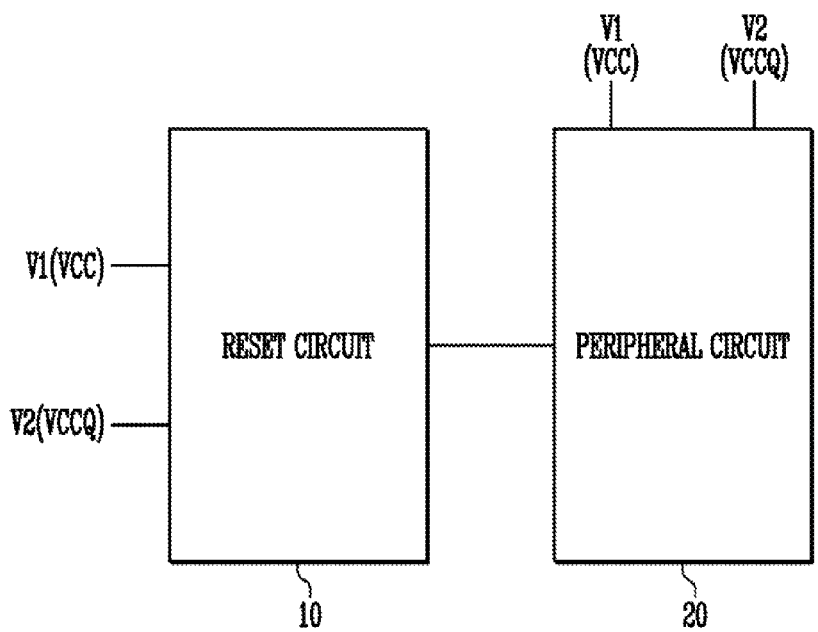
FIG. 1 is a block diagram illustrating an integrated circuit according to an embodiment of the present invention.

Hereinafter, an embodiment of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram illustrating an integrated circuit according to an embodiment of the present invention.

Referring to FIG. 1, an integrated circuit includes a reset circuit 10 and a peripheral circuit 20.

The peripheral circuit 20 may use a first voltage V1 or a second voltage V2 as an operation voltage source, or may use both the first voltage V1 and the second voltage V2 as the operation voltage sources. Here, the first voltage V1 may be a voltage supplied from the outside, for example, VCC, and the second voltage V2 may be an internally generated voltage, for example, VCCQ. The peripheral circuit 20 may include one or more of an input buffer, an output buffer, a level shifter, a transmission gate, and a latch.

The reset circuit 10 may reset the peripheral circuit 2, which uses the first voltage V1 or the second voltage V2, one of which has lower level than a reference level, as the operation voltage source. The reset circuit 10 may be connected to an input terminal or an output terminal of the peripheral circuit, or one or more of the input buffer, the output buffer, the level shifter, the transmission gate, and the latch. Here, the reference level may correspond to a threshold voltage of an NMOS transistor, and detailed description will be set forth below.

When a supply of the power source is stopped and then is started again, a reset operation for initializing the circuit may be performed. However, if one of several power sources is decreased to have the reference level or lower, the reset operation may not be performed. Further, when the power source is not recovered to have the reference level or higher even though the reset operation is performed, the circuit may be abnormally operated.

The reset circuit 10 maintains the peripheral circuit reset while the peripheral circuit 20 is using the first voltage V1 or the second voltage V2, one of which has lower level than the reference level as the operation voltage sources until a level of the operation voltage source is equal to or higher than the reference level. That is, when one of levels of the first voltage V1 and the second voltage V2 has lower level than the reference level, the reset circuit 10 keeps the peripheral circuit 20 reset or initialized until the levels of the first voltage V1 and the second voltage V2 are equal to or higher than the reference level.

As a result, it is possible to improve stabilization of the operation and the electrical characteristic of the peripheral circuit 20 by preventing an erroneous operation of the circuit and preventing an abnormal current path from being formed. In the meantime, the reset circuit 10 may reset the peripheral circuit 20 by using a higher voltage between the first voltage V1 and the second voltage V2.

The reset circuit 10 will be described in more detail.

Figure 2:
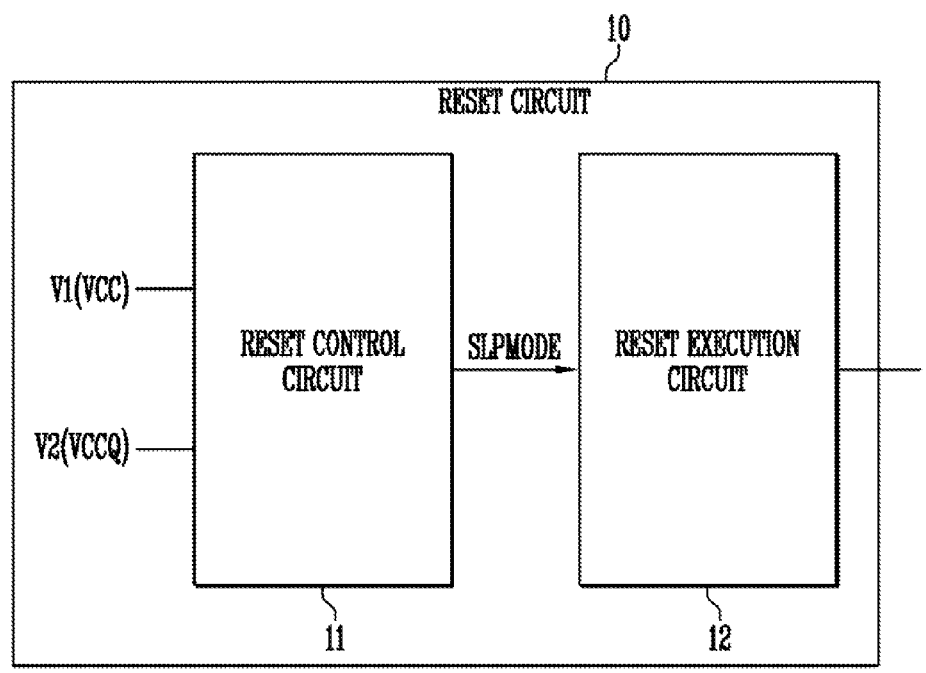
FIG. 2 is a block diagram illustrating a reset circuit according to the embodiment of the present invention.

FIG. 2 is a block diagram illustrating the reset circuit 10 shown in FIG. 1.

Referring to FIG. 2, the reset circuit 10 includes a reset control circuit 11 and a reset execution circuit 12. The reset control circuit 11 may output a reset signal SLPMODE when one of the first voltage V1 and the second voltage V2 has lower level than the reference level. The reset execution circuit 12 may reset the peripheral circuit based on the reset signal SLPMODE. Here, the reset execution circuit 12 may be connected to the peripheral circuit 20.

Particularly, the reset control circuit 11 may activate the reset signal SLPMODE while one of the first voltage V1 and the second voltage V2 has lower level than the reference level. In this case, the reset control circuit 11 may output the reset signal SLPMODE by using higher one of the first voltage V1 and the second voltage V2. When both the first voltage V1 and the second voltage V2 have higher levels than the reference level, or stops power supply, which means that both the first voltage V1 and the second voltage V2 have lower levels than the reference level, the control circuit 11 may be deactivated.

Further, the reset execution circuit 12 maintains the peripheral circuit initialized during the activation of the reset signal SLPMODE. That is, the reset execution circuit 12 maintains the peripheral circuit initialized based on the enabled reset signal SLPMODE due to one of the first voltage V1 and the second voltage V2 that has lower level than the reference level.

Hereinafter, the reset control circuit will be described in more detail.

Figure 3A:
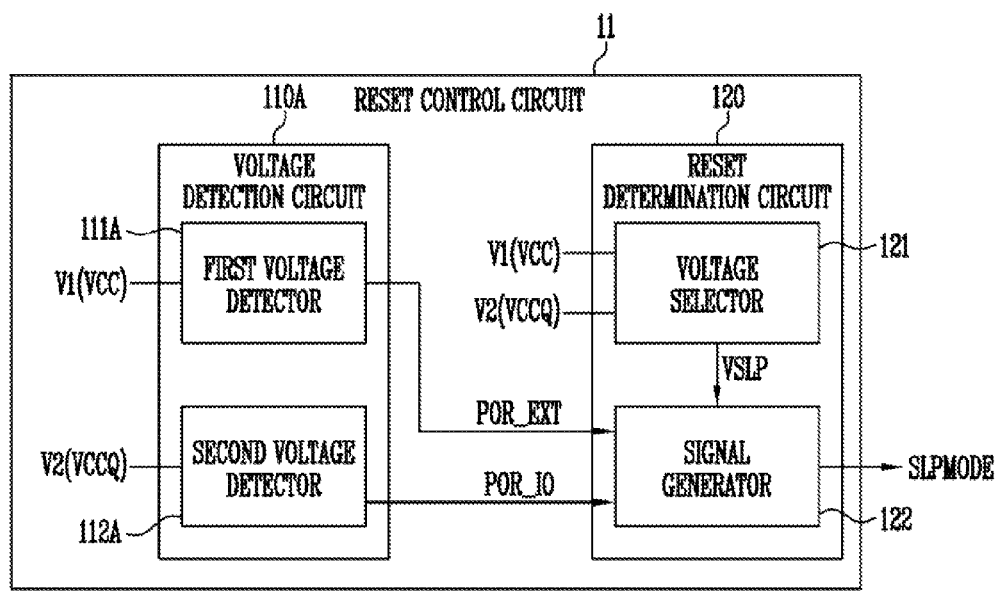
FIGS. 3A and 3B are block diagrams illustrating reset control circuits according to the embodiment of the present invention.
Figure 3B:
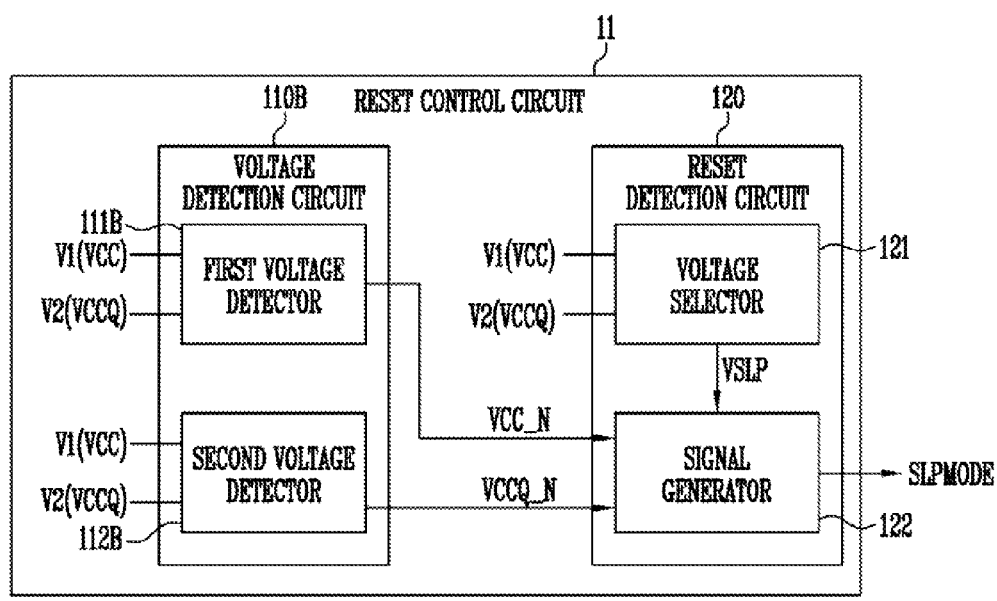

FIGS. 3A and 3B are block diagrams illustrating the reset control circuits according to the embodiment of the present invention.

Referring to FIG. 3A, the reset control circuit 11 includes a voltage detection circuit 110A and a reset determination circuit 120.

The voltage detection circuit 110A detects a level of each of the first voltage V1 and the second voltage V2, and is configured to output detection signals POR_EXT and POR_IO when one of the first voltage V1 and the second voltage V2 has lower level than the reference level. The voltage detection circuit 110A may keep the detection signal POR_EXT or POR_IO activated while one of the first voltage V1 and the second voltage V2 has lower level than the reference level.

Particularly, the voltage detection circuit 110A includes a first voltage detector 111A for outputting a first detection signal POR_EXT when the first voltage V1 has lower level than the reference level, and a second voltage detector 112A for outputting a second detection signal POR_IO when the second voltage V2 has lower level than the reference level. The voltage detectors 111A and 112A output the detection signals POR_EXT and POR_IO with the low level, respectively, when the voltages V1 and V2 are higher than the reference level, and the voltage detectors 111A and 112A output the voltages V1 and V2 as the detection signals POR_EXT and POR_IO, respectively, when the voltages V1 and V2 are lower than the reference level.

Figure 4A:
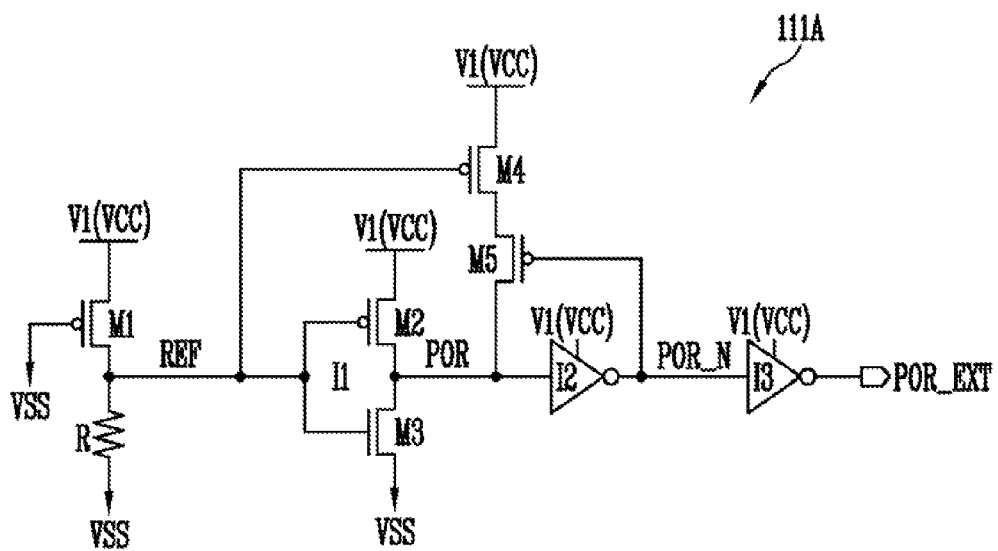
FIGS. 4A and 4B are circuit diagrams illustrating voltage detectors according to the embodiment of the present invention.
Figure 4B:
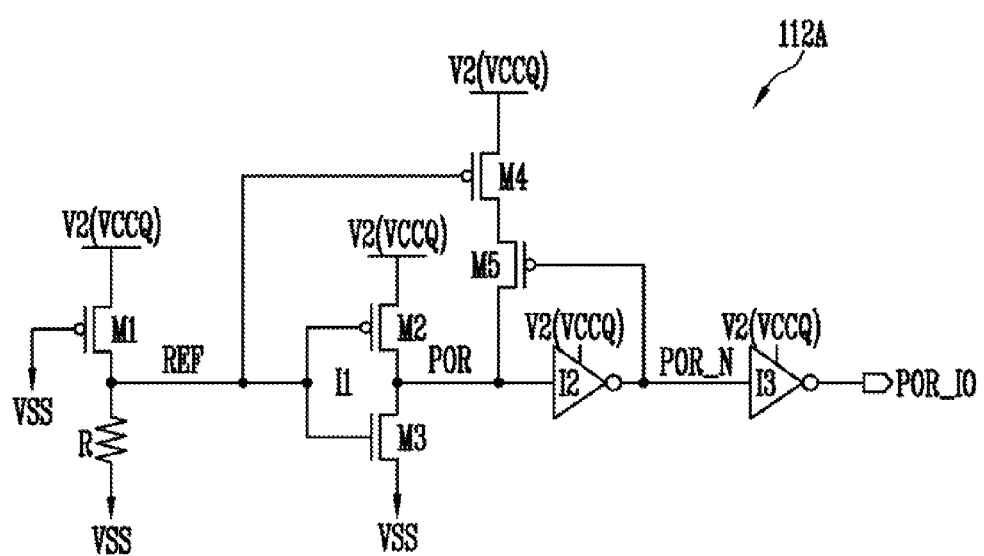

The configurations of the first voltage detector 111A and the second voltage detector 112A will be described below. FIGS. 4A and 4B are circuit diagrams illustrating the voltage detectors according to the embodiment of the present invention.

Referring to FIG. 4A, the first voltage detector 111A may be implemented with at least transistors M1 to M5, inverters I1, I2, and I3, and a resistor R.

As an example, the transistor M1, which is a PMOS transistor, is connected between a power voltage terminal to which the first voltage V1 is applied and a node REF, and a ground voltage VSS may be applied to the gate. The resistor R may be connected between the node REF and a ground voltage terminal to which the ground voltage VSS is applied.

The inverters I1, I2, and I3 are serially connected between the node REF and an output node, The first voltage V1 supplied as the operation voltage to the inverters I1, I2, and I3.

The transistors M4 and M5, which are PMOS transistors, are serially connected between an output node POR of the inverter I1 and the power voltage terminal. A gate of the transistor M4 is connected with the node REF, and a gate of the transistor M5 is connected with an output node POR_N of the inverter I2.

When the first voltage V1 has lower level than the reference level the transistor M2 is turned on. As a result, the first voltage V1 is transferred to the node POR and the first detection signal POR_EXT is output with the same level as that of the first voltage V1 by the inverters I2 and I3. That is, while the first voltage V1 has lower level than the reference level, the first voltage detector 111A outputs the first voltage V1 as the first detection signal POR_EXT. Here, the reference level corresponds to a threshold voltage of the transistor M3.

When the first voltage V1 is higher than the reference level, for example, the threshold voltage of the transistor M3, the transistor M3 is turned on. As a result, the node POR has a low level, and the first detection signal POR_EXT has a low level by the inverters I2 and I3. That is, while the first voltage V1 is higher than the reference level, the first voltage detector 111A outputs the first detection signal POR_EXT with the low level.

Referring to FIG. 4B, the second voltage detector 112A may be identically configured as the first detector 111A. However, the second voltage detector 112A is different from the first voltage detector 111A in that the second voltage V2 is applied instead of the first voltage V1.

Similarly, while the second voltage V2 has lower level than the reference level, the second voltage detector 112A outputs the second voltage V2 as the second detection signal POR_IO with the same level as that of the second voltage V2. Here, the reference level corresponds to the threshold voltage of the transistor M3.

When the second voltage V2 is higher than the reference level, for example, the threshold voltage of the transistor M3, the transistor M3 is turned on. As a result, the node POR has a low level, and the second detection signal POR_IO has a low level by the inverters I2 and I3. That is, while the second voltage V1 is higher than the reference level, the second voltage detector 112A outputs the second detection signal POR_IO with the low level.

As described above, the voltage detectors 111A and 112A output the detection signals POR_EXT and POR_IO with the low level, respectively, when the voltages V1 and V2 are higher than the reference level, and output the voltages V1 and V2 as the detection signals POR_EXT and POR_IO in the activation condition when the voltages V1 and V2 are lower than the reference level.

In the meantime, as illustrated in FIG. 3B, first and second voltage detectors 111B and 112B may also be implemented in another form. For example, the first voltage detector 111B may use the second voltage V2 as the operation voltage source, and the second voltage detector 112B may use the first voltage V1 as the operation voltage source. That is, the first voltage detector 111B may output a first detection signal VCC_N of the first voltage V1 by using the second voltage V2, and output a second detection signal VCCQ_N of the second voltage V2 by using the first voltage V1. An example thereof will be described in more detail.

Figure 5A:
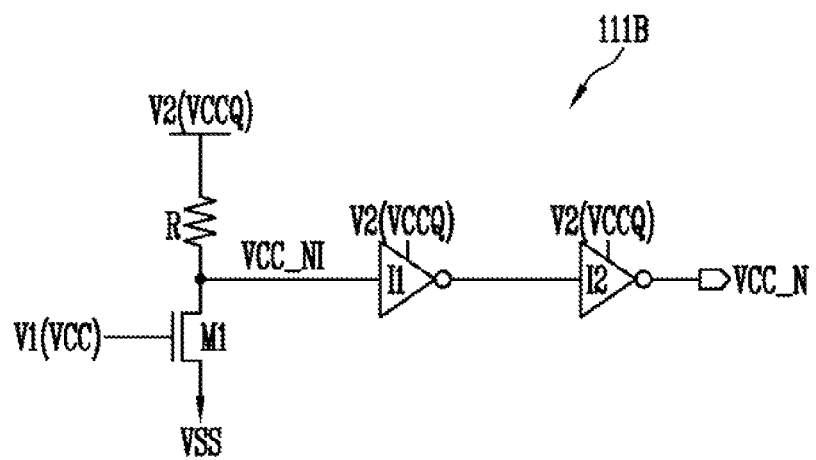
FIGS. 5A and 5B are circuit diagrams illustrating voltage detectors according to another embodiment of the present invention.
Figure 5B:
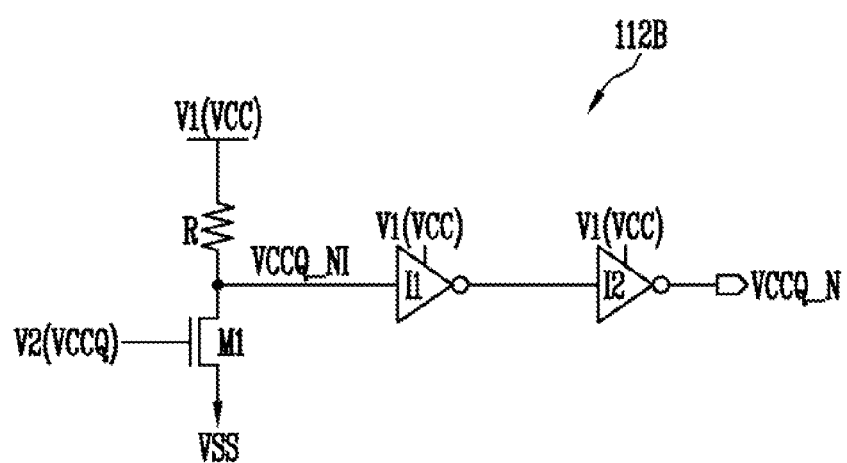

FIGS. 5A and 5B are circuit diagrams illustrating voltage detectors according to another embodiment of the present invention.

Referring to FIG. 5A, a first voltage detector 111B may be implemented with at least a transistor M1, inverters I1 and I2, and a resistor R.

For example, the resistor R is connected with a power voltage terminal to which a second voltage V2 is applied and a node VCC_NI. The transistor M1, which is an NMOS transistor, and may be connected between the node VCC_NI and a ground voltage terminal to which a ground voltage VSS is applied, and a first voltage V1 may be applied to a gate. The inverters I1 and I2 are serially connected between the node VCC_NI and an output node. In this case, the second voltage V2 is supplied to the inverters I1 and I2 as an operation voltage.

When the first voltage V1 is lower than a reference level, the transistor M1 is turned off. As a result, the second voltage V2 is transferred to the node VCC_NI, and the first detection signal VCC_N is output with the same level as that of the second voltage V2 (or a high level) by the inverters I1 and I2. That is, while the first voltage V1 has lower level than the reference level, the first voltage detector 111B outputs the first detection signal VCC_N by using the second voltage V2. Here, the reference level corresponds to a threshold voltage of the transistor M1.

When the first voltage V1 is higher than the reference level, for example, the threshold voltage of the transistor M1 the transistor M1 is turned on. As a result, the node VCC_NI has a low level, and the first detection signal VCC_N has a low level by the inverters I1 and I2. That is, while the first voltage V1 is higher than the reference level, the first voltage detector 111B outputs the first detection signal VCC_N with the low level.

Referring to FIG. 5B, the second voltage detector 112B may be identically configured as the first voltage detector 111B. However, the second voltage detector 112B is different from the first voltage detector 111B in that the second voltage V2 is applied to the gate of the transistor M1 instead of the first voltage V1 and the first voltage V1 is supplied as the operation voltage instead of the second voltage V2.

Similarly, while the second voltage V2 has lower level than the reference level, the second voltage detector 112B outputs a second detection signal VCCQ_N with the same level as that of the first voltage V1. That is, while the second voltage V2 has lower level than the reference level, the first detector 111B outputs the first voltage V1 of a high level as the second detection signal VCC_N. Here, the reference level corresponds to a threshold voltage of the transistor M1.

When the second voltage V2 is higher than the reference level, for example, the threshold voltage of the transistor M1, the transistor M1 is turned on. As a result, a node VCCQ_NI has a low level, and the second detection signal VCCQ_N has a low level by the inverters I1 and I2. That is, while the second voltage V2 is higher than the reference level, the second voltage detector 112B outputs the second detection signal VCCQ_N with the low level.

As described above, the voltage detectors 111B and 112B output the detection signals VCC_N and VCCQ_N with the low level when the voltages V1 and V2 are higher than the reference level, and output the detection signals VCC_N and VCCQ_N in the activation condition when the voltages V1 and V2 are lower than the reference level.

In the meantime, the voltage detection circuit may include the first voltage detector 111A of FIG. 4A and the second voltage detector 112B of FIG. 5B, or the first voltage detector 111B of FIG. 4B and the second voltage detector 112A of FIG. 5A.

Referring to FIG. 3A again, the reset determination circuit 120 is configured to output the reset signal SLPMODE in response to the detection signals POR_EXT and POR_IO. The reset determination circuit 120 of FIG. 3B is configured to output the reset signal SLPMODE in response to the detection signals VCC_N and VCCQ_N. Further, the reset determination circuit 120 may also output the reset signal SLPMODE in response to one detection signal between the detection signals POR_EXT and VCC_N and one detection signal between the detection signals POR_IO and VCCQ_N. Hereinafter, the reset determination circuit 120 illustrated in FIG. 3A is described as an example.

The reset determination circuit 120 is configured to activate the reset signal SLPMODE output in response to the activated detection signal POR_EXT or POR_IO. That is, the reset determination circuit 120 is configured to activate the reset signal SLPMODE while the first voltage V1 or the second voltage V2 is lower than the reference level. Further, the reset determination circuit 120 may be configured to output the reset signal SLPMODE by using the higher voltage between the first voltage V1 and the second voltage V2. That is, the reset determination circuit 120 may output the reset signal SLPMODE by using a normal voltage higher than the reference level between the first voltage V1 and the second voltage V2.

The reset determination circuit 120 includes a voltage selector 121 and a signal generator 122. The voltage selector 121 is configured to output the higher voltage between the first voltage V1 and the second voltage V2. That is, the higher voltage between the first voltage V1 and the second voltage V2 becomes an output voltage VSLP of the voltage selector 121. The signal generator 122 is configured to output the reset signal SLPMODE with the output voltage VSLP of the voltage selector 121 in response to the detection signals POR_EXT and POR_IO. The respective elements will be described in more detail below.

Figure 6:
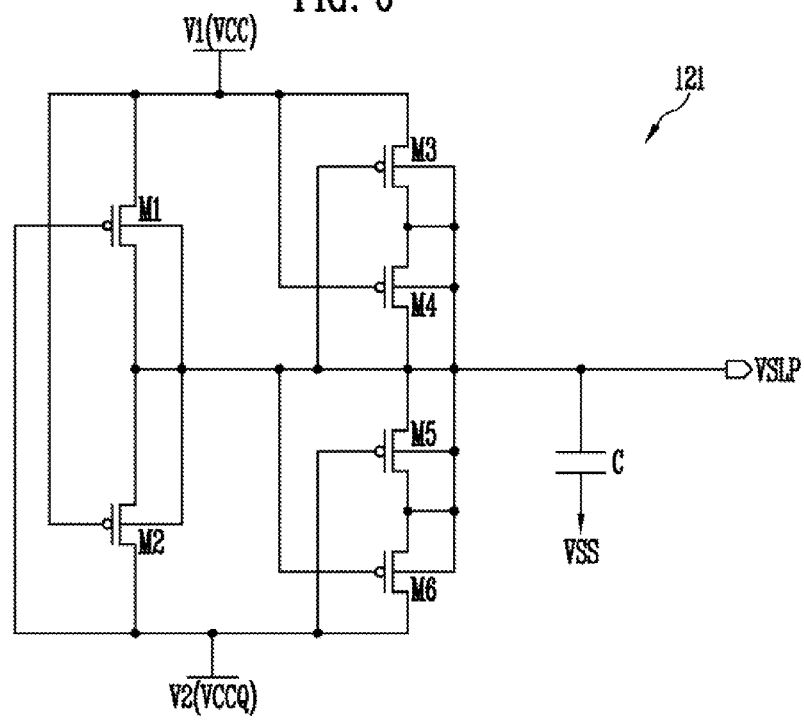
FIG. 6 is a circuit diagram illustrating a voltage selector according to the embodiment of the present invention.

FIG. 6 is a circuit diagram illustrating the voltage selector according to the embodiment of the present invention.

Referring to FIG. 6, the voltage selector 121 includes the transistors M1 to M6.

The transistors M1 and M2 are the PMOS transistors, and are serially connected between the first power voltage terminal to which the first voltage V1 is applied and the second power voltage terminal to which the second voltage V2 is applied. The gate of the transistor M1 is connected with the second power voltage terminal and the gate of the transistor M2 is connected with the first power voltage terminal.

Here, connection node of the transistors M1 and M2 is an output node VSLP. When the first voltage V1 has lower level than the reference level, the transistor M2 is turned on, and the second voltage V2 that is higher than the reference level is transferred to the output node VSLP. That is, the second voltage V2 is the output voltage VSLP when the first voltage V1 has lower level than the reference level.

Likewise, when the second voltage V2 has lower level than the reference level, the transistor M1 is turned on, the first voltage V1 higher than the reference level is transferred to the output node VSLP. That is, the first voltage V1 is the output voltage VSLP when the second voltage V2 has lower level than the reference level.

In the meantime, bulk biases of the PMOS transistors need to always be high, so that the transistors M3, M4, M5, and M6 may be additionally implemented. For example, the transistors M3 and M4 are serially connected between the first power voltage terminal and the output node VSLP. The gate of the transistor M3 connected with the first power voltage terminal is connected with the output node VSLP, and the gate of the transistor M4 connected with the output node VSLP is connected with the first power voltage terminal.

The transistors M5 and M6 are serially connected between the output node VSLP and the second power voltage terminal. The gate of the transistor M5 connected with the output node VSLP is connected with the second power voltage terminal, and a gate of the transistor M6 connected with the second power voltage terminal is connected with the output node VSLP. A load capacitor C may be connected to the output node VSLP.

Figure 7:
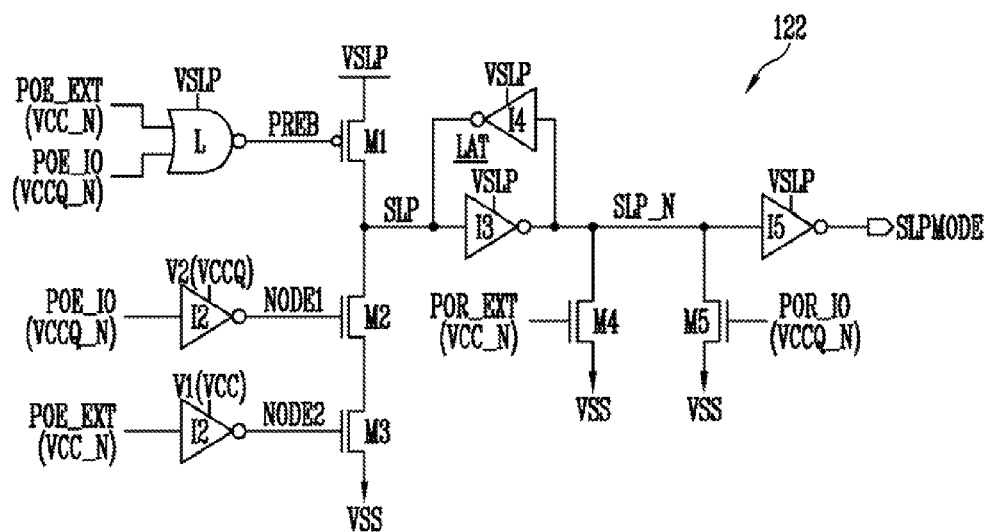
FIG. 7 is a circuit diagram illustrating a signal generator according to the embodiment of the present invention.

FIG. 7 is a circuit diagram illustrating the signal generator according to the embodiment of the present invention.

Referring to FIG. 7, the signal generator 121 includes the transistors M1, M2, M3, M4, and M5, a logic device L, and the inverters I2, I3, I4, and I5.

When the first detection signal POR_EXT or VCC_N and the second detection signal POR_IO or VCCQ_N are input, and one of the first voltage V1 and the second voltage V2 has lower level than the reference level, the logic device L outputs a signal PREB with a low level based on activated one of the detection signals VCC_N and VCCQ_N. The output voltage VSLP of the voltage selector may be applied to the logic device L as the operation voltage.

The inverter I1 outputs a signal NODE1 based on the second detection signal POR_IO or VCCQ_N. In this case, since the second voltage V2 is applied to the inverter I1 as the operation voltage, even though the second detection signal POR_IO is applied with the low level, when the second voltage V2 is lower than the reference level, the output signal NODE1 may have the low level.

The inverter I2 outputs a signal NODE2 based on the first detection signal POR_EXT or VCC_N. In this case, since the first voltage V1 is applied to the inverter I2 as the operation voltage, even though the first detection signal POR_EXT is applied with the low level, when the first voltage V1 is lower than the reference level, the first detection signal POR_EXT may not be reversed and the output signal NODE1 may have the low level.

The transistors M1, M2, and M3 are serially connected between the power voltage terminal to which the output voltage VSLP of the power selector is applied and the ground voltage terminal. The output signal PREB of the logic device L is applied to the gate of the transistor M1, the output signal NODE1 of the inverter I1 is applied to the gate of the transistor M2, and the output signal NODE2 of the inverter I2 is applied to the gate of the transistor M3.

A first node of the latch LAT is connected to a connection node of the transistors M1 and M2, and a second node of the latch LAT is connected to an input terminal of the inverter I5. The reset signal SLPMODE is output from the inverter I5. The output voltage VSLP of the voltage selector 121 is supplied to the latch LAT and the inverter I5 as the operation voltage. The transistor M4 operated based on the first detection signal POR_EXT and the transistor M5 operated based on the second detection signal POR_IO are connected in parallel between the input terminal of the inverter I5 and the ground terminal.

Hereinafter, an operation of the reset control circuit including the aforementioned elements will be described.

Figure 8:
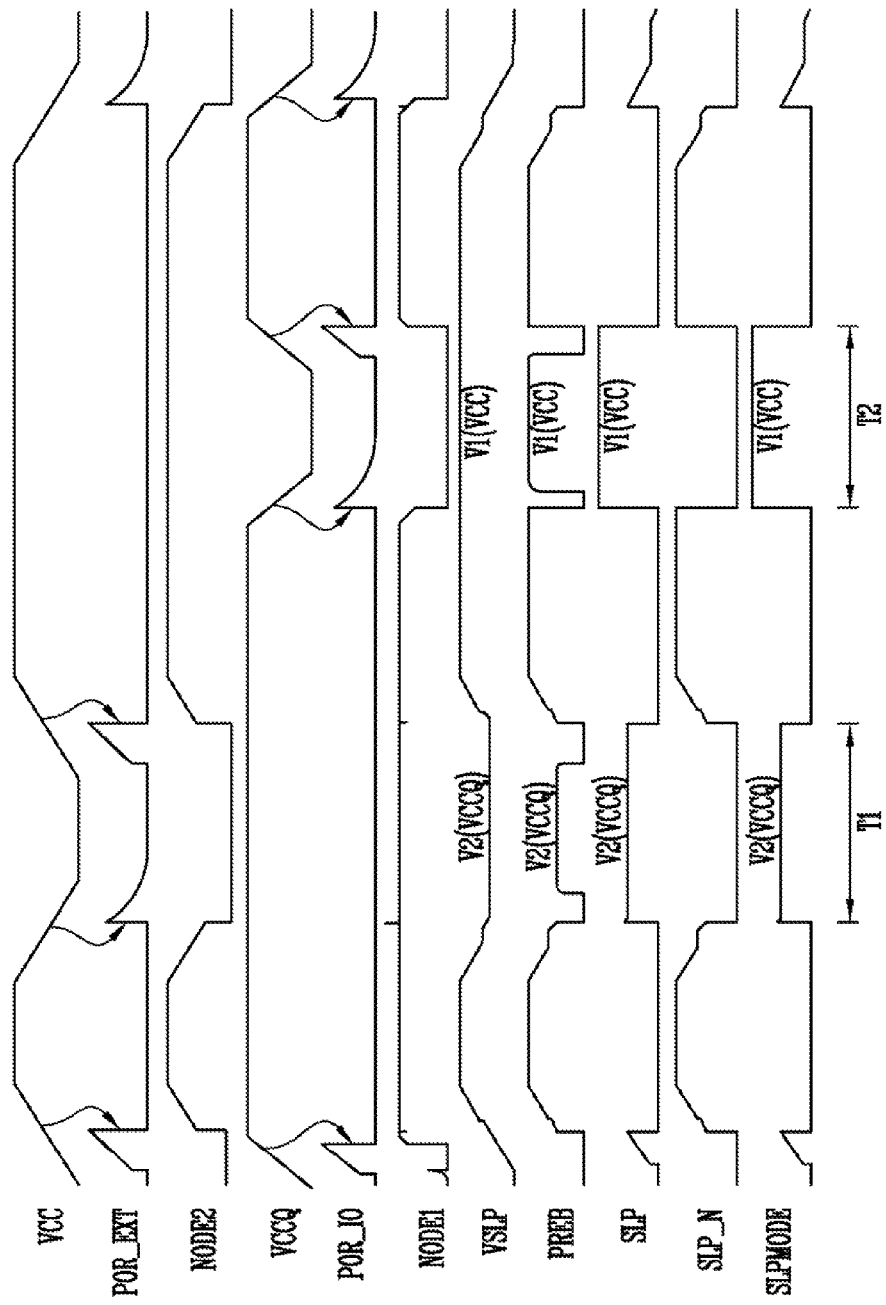
FIG. 8 is a waveform illustrating an operation of the reset control circuit according to the embodiment of the present invention.

FIG. 8 is a waveform illustrating an operation of the reset control circuit according to the embodiment of the present invention.

Referring to FIGS. 7 and 8, a first time period T1 where the first voltage V1 has lower level than the reference level, a second time period T2 where the second voltage V2 has lower level than the reference level, and the remaining time periods will be described.

First Time Period T1

When the first voltage V1 has lower level than the reference level or the supply of the first voltage V1 is stopped, as described with reference to FIG. 4A, the first detection signal POR_EXT, which is the first voltage V1, has the lower lever than the reference level according to the first voltage V1. Since the second voltage V2 is higher than the reference level, as described with reference to FIG. 4B, the second detection signal POR_IO has the low level. That is, of the detection signals POR_EXT and POR_IO have the lower levels than the reference level.

In response to the detection signals POR_EXT and POR_IO, the logic device L outputs the signal PREB with the same level as that of the second voltage V2, the inverter I1 outputs the signal NODE1 with the high level. Since the first voltage V1 is supplied to the inverter I2 as the operation voltage, even though the first detection signal POR_EXT has the low level, the inverter I2 outputs the signal NODE2 with the low level.

In the meantime, the second voltage V2 becomes the output voltage VSLP of the voltage selector 121, and the output voltage VSLP is supplied to the power voltage terminal and the inverters I3, I4, and I5 as the operation voltage.

The transistors M1 and M2 are turned on and the transistor M3 is turned off based on the signals PREB, NODE1 and NODE2. As a result, a voltage SLP at the connection node of the transistors M1 and M2 is the second voltage V2, and the reset signal SLPMODE with the high level is output through the latch LAT and the inverter I5. That is, the output voltage VSLP of the voltage selector 121 corresponding to the second voltage V2 is output as the reset signal SLPMODE when the first voltage V1 has lower level than the reference level or the supply of the first voltage V1 is stopped.

In the meantime, even though the first voltage V1 has lower level than the reference level, the transistor M5 is stably turned on based on the second detection signal POR_IO generated by the second voltage V2 higher than the reference level, and the input terminal of the inverter I5 is fixed with the low level. Accordingly, the reset signal SLPMODE is stably output with the high level. The transistors M4 and M5 may be removed. Further, the reset signal SLPMODE maintains the high level for the time period T1 in which the first voltage V1 has lower level than the reference level.

The reset signal SLPMODE with the high level is input into the reset circuit, and the reset circuit keeps the peripheral circuit initialized based on the reset signal SLPMODE. Detailed contents will be described below.

Second Time Period T2

When the second voltage V2 has lower level than the reference level or the supply of the second voltage V2 is stopped, as described with reference to FIG. 4B, the second detection signal POR_IO has the lower level than the reference level according to the second voltage V2. Since the first voltage V1 is higher than the reference level, as described with reference to FIG. 4A, the first detection signal POR_EXT has the low level. That is, all of the detection signals POR_EXT and POR_IO have the lower levels than the reference level.

As all of the detection signals POR_EXT and POR_IO have the lower levels, the reset signal SLPMODE is output with the high level similar to that in the first section T1. However, the first voltage V1 is the output voltage VSLP of the voltage selector, the output voltage VSLP of the voltage selector corresponding to the first voltage V1 is output as the reset signal SLPMODE.

The reset signal SLPMODE with the high level is input into the reset circuit, and the reset circuit keeps the peripheral circuit initialized based on the reset signal SLPMODE. Detailed contents will be described below.

The Remaining Time Periods

If all of the first and second voltages V1 and V2 are higher than the reference level, the circuit performs a normal operation without keeping the peripheral circuit initialized because the reset signal SLPMODE is output with the low level, and the reset operation is not executed.

Further, if all of the first and second voltages V1 and V2 are lower than the reference level, since all of the elements of the circuit are not operated, an abnormal current path is not generated.

Hereinafter, the reset operation will be described.

Figure 9A:
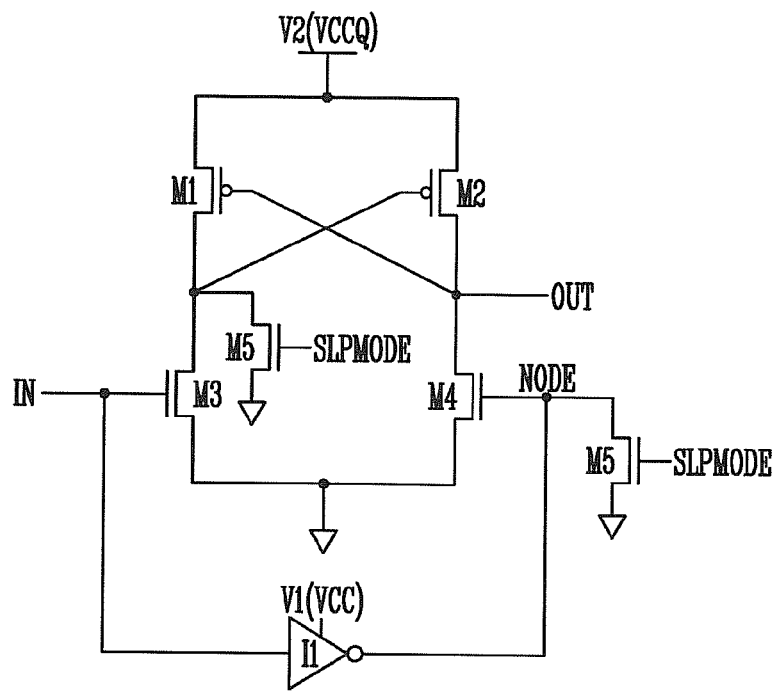
FIGS. 9A and 9E are circuit diagrams illustrating integrated circuits according to embodiments of the present invention.
Figure 9B:
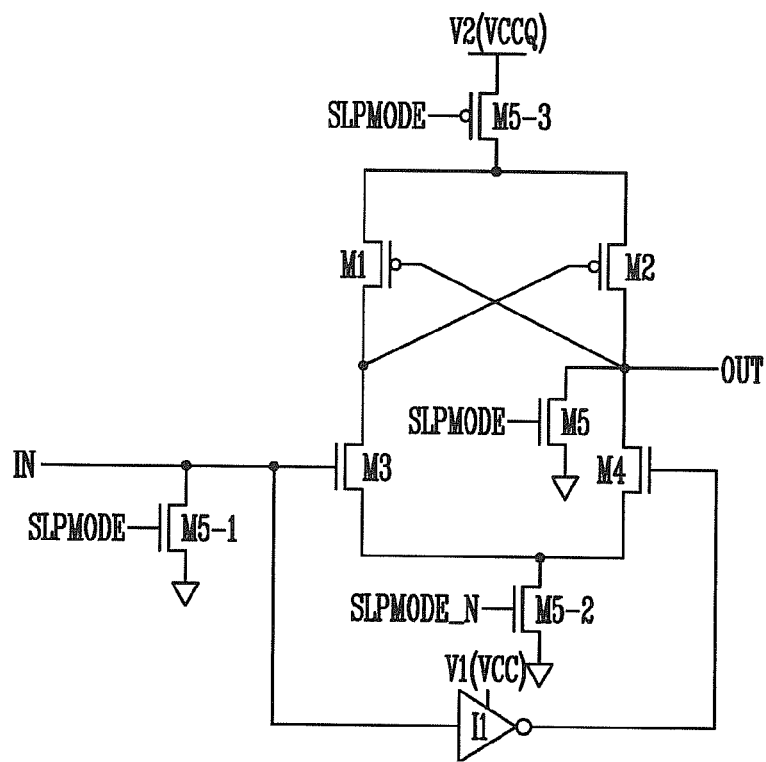
Figure 9C:
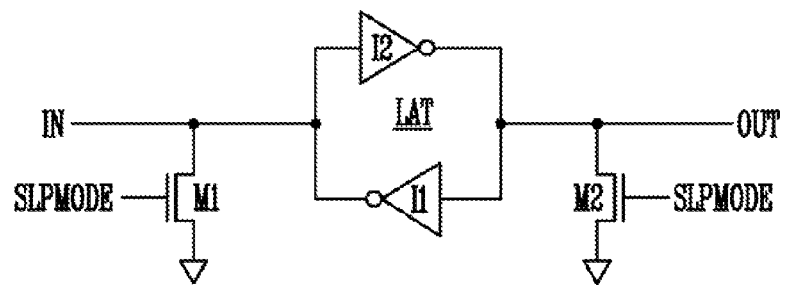
Figure 9D:
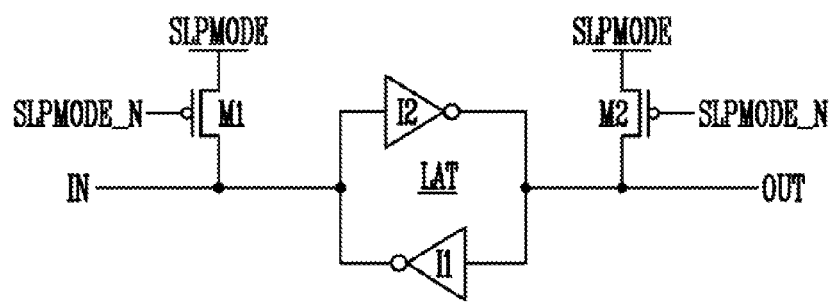
Figure 9E:
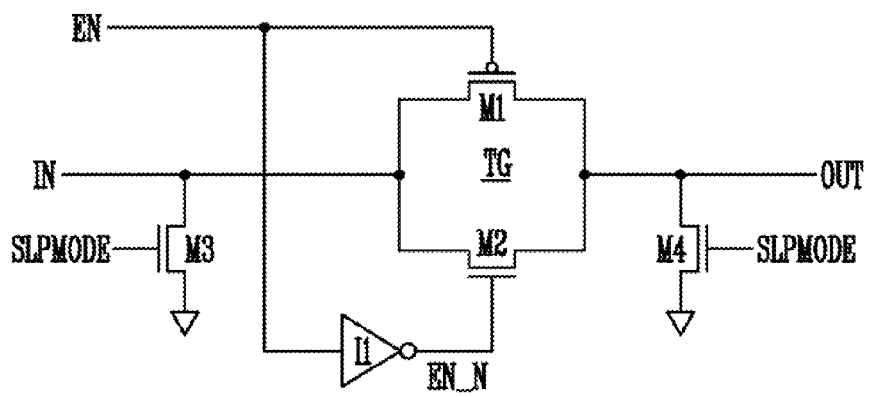

FIGS. 9A and 9E are circuit diagrams illustrating integrated circuits according to embodiments of the present invention.

Referring to FIG. 9A, the transistors M1, M2, M3, and M4 and the inverter I1 form a level shifter. The level shifter outputs the second voltage V2 as an output voltage OUT when the first voltage V1 is input as an input voltage IN.

The reset circuits M5 and M6 operated based on the reset signal SLPMODE is connected to an input terminal of the level shifter. When the first voltage V1 has lower level than the reference level, the reset signal SLPMODE is activated, and the reset circuits M5 and M6 initialize the output voltage OUT of the level shifter to the second voltage V2 based on the reset signal SLPMODE in the activation condition for the time period in which the first voltage V1 has lower level than the reference level.

The transistor M6 of the reset circuit may prevent an abnormal current path from being formed through the transistors M2 and M4 because the transistor M4 is abnormally turned on That is, the transistor M6 of the reset circuit may turn off the transistor M4 based on the reset signal.

Referring to FIG. 9B, if the output voltage OUT of the level shifter is set as the ground voltage for the initialization operation, the reset circuit may be connected to an output terminal of the level shifter. Particularly, the reset circuit includes the transistor M5, and may further include at least one transistor among transistors M5-1, M5-2, and M5-3. The transistor M5 may set the output voltage OUT as the ground voltage. The transistors M5-1, M5-2 and M5-3 may prevent an abnormal current path from being formed.

Referring to FIG. 9C, the reset circuit M1 or M2 operated based on the reset signal SLPMODE may be connected to the input terminal of the latch into which the voltage IN is input or the output terminal of the latch LAT from which the voltage OUT is output. The reset circuit M1 or M2 may be implemented as the NMOS transistor.

Referring to FIG. 9D, the reset circuit M1 or M2 may be implemented as the PMOS transistor. In this case, the reset circuit M1 or M2 may be operated based on a reverse reset signal SLPMODE_N.

Referring to FIG. 15, the reset circuit M3 or M4 may be connected to a transmission gate TG operated based on an enable signal EN and a reverse enable signal EN_N of the inverter I1. That is, the reset circuit M3 or M4 operated based on the reset signal SLPMODE may be connected to the input terminal of the transmission gate TG into which the voltage IN is input or the output terminal of the transmission gate TG from which the voltage OUT is output. The reset circuit M1 or M2 may be implemented as the NMOS transistor. As illustrated in FIG. 9D, in a case where the reset circuit M3 or M4 is implemented as the PMOS transistor, the reset circuit M1 or M2 may be operated based on the reverse reset signal SLPMODE_N.

As described above, the embodiment has been disclosed in the drawings and the specification. The specific terms used herein are for purposes of illustration and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. An integrated circuit, comprising:
a reset control circuit suitable for outputting a reset signal when one of a first voltage and a second voltage has lower level than a reference level; and
a reset execution circuit suitable for resetting a peripheral circuit based on the reset signal,
wherein the reset control circuit outputs a higher one of the first voltage and the second voltage as the reset signal.

2. The integrated circuit of claim 1, wherein the reset control circuit keeps the reset signal activated while one of the first voltage and the second voltage has lower level than the reference level.

3. The integrated circuit of claim 2, wherein the reset control circuit keeps the peripheral circuit initialized during activation of the reset signal.

4. The integrated circuit of claim 1, wherein the reset execution circuit keeps the peripheral circuit initialized while one of the first voltage and the second voltage has lower level than the reference level.

5. The integrated circuit of claim 1, wherein the reset control circuit includes:
a voltage detection circuit suitable for outputting a detection signal based on whether one of the first voltage and the second voltage has lower level than the reference level; and a reset determination circuit suitable for outputting the reset signal based on the detection signals.

6. The integrated circuit of claim 5, wherein the voltage detection circuit outputs an activated detection signal while one of the first voltage and the second voltage has lower level than the reference level.

7. The integrated circuit of claim 5, wherein the voltage detection circuit includes:
a first voltage detector suitable for outputting a first detection signal when the first voltage has lower level than the reference level; and
a second voltage detector suitable for outputting a second detection signal when the second voltage has lower level than the reference level.

8. The integrated circuit of claim 7, wherein the first voltage detector uses the second voltage as an operation voltage source, and
the second voltage detector uses the first voltage as an operation voltage source.

9. The integrated circuit of claim 6, wherein the reset determination circuit activates the reset signal during activation of the detection signal.

10. The integrated circuit of claim 5, wherein the reset determination circuit activates the reset signal while one of the first voltage and the second voltage has lower level than the reference level.

11. The integrated circuit of claim 5, wherein the reset determination circuit outputs a higher one of the first voltage and the second voltage as the reset signal.

12. The integrated circuit of claim 5, wherein the reset determination circuit includes:
a voltage selector suitable for outputting a higher one of the first voltage and the second voltage; and
a signal generator suitable for outputting as the reset signal the higher one of the first voltage and the second voltage based on the detection signal.

13. The integrated circuit of claim 1, wherein the reference level corresponds to a threshold voltage of an NMOS transistor.

14. An integrated circuit, comprising:
a peripheral circuit using one or more of a first voltage and a second voltage as an operation voltage source; and
a reset circuit suitable for resetting the peripheral circuit when one of the first voltage and the second voltage has lower level than a reference level,
wherein the reset circuit resets the peripheral circuit using a lower one of the first voltage and the second voltage as the operation voltage source by using a higher one of the first voltage and the second voltage.

15. The integrated circuit of claim 14, wherein the reset circuit keeps the peripheral circuit initialized while one of the first voltage and the second voltage has lower level than a reference level.

16. The integrated circuit of claim 14, wherein the peripheral circuit is connected to an input terminal or an output terminal of the reset circuit.

* * * * *